United States Patent
Hultmark et al.

(10) Patent No.: US 6,599,774 B2
(45) Date of Patent: *Jul. 29, 2003

(54) TECHNIQUE FOR UNDERFILLING STACKED CHIPS ON A CAVITY MLC MODULE

(75) Inventors: Eric B. Hultmark, Wappingers Falls, NY (US); Brian C. Noble, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

This patent is subject to a terminal disclaimer.

(21) Appl. No.: 09/840,380

(22) Filed: Apr. 23, 2001

(65) Prior Publication Data

US 2001/0021542 A1 Sep. 13, 2001

Related U.S. Application Data

(62) Division of application No. 09/343,651, filed on Jun. 29, 1999, now Pat. No. 6,232,667.

(51) Int. Cl.[7] ............... H01L 21/44; H01L 21/48; H01L 21/50; H01L 21/31
(52) U.S. Cl. ............ 438/107; 438/109; 438/110; 438/112; 438/124; 438/127; 438/778
(58) Field of Search .................. 438/109, 110, 438/107, 108, 112, 124, 126, 127, 613, 778

(56) References Cited

U.S. PATENT DOCUMENTS

| | | |
|---|---|---|
| 4,323,914 A | 4/1982 | Berndlmaier et al. |
| 4,953,005 A | 8/1990 | Carlson et al. |
| 5,191,404 A | 3/1993 | Wu et al. |
| 5,289,337 A * | 2/1994 | Aghazadeh et al. ........ 361/718 |
| 5,383,269 A | 1/1995 | Rathmell et al. |
| 5,399,898 A | 3/1995 | Rostoker |
| 5,475,262 A | 12/1995 | Wang et al. |
| 5,583,321 A | 12/1996 | DiStefano et al. |
| 5,591,959 A | 1/1997 | Cigna et al. |
| 5,600,541 A | 2/1997 | Bone et al. |
| 5,604,377 A | 2/1997 | Palagonia |
| 5,608,262 A | 3/1997 | Degani et al. |
| 5,661,339 A | 8/1997 | Clayton |
| 5,760,478 A * | 6/1998 | Bozso et al. ................. 257/777 |
| 5,869,896 A * | 2/1999 | Baker et al. ................. 257/724 |
| 5,963,429 A * | 10/1999 | Chen .......................... 361/764 |
| 6,008,536 A * | 12/1999 | Mertol ....................... 257/704 |
| 6,011,696 A | 1/2000 | Mahajan et al. |
| 6,084,308 A * | 7/2000 | Kelkar et al. ................ 257/777 |
| 6,104,084 A | 8/2000 | Ishio et al. |
| 6,133,064 A * | 10/2000 | Nagarajan et al. .......... 438/106 |
| 6,133,626 A | 10/2000 | Hawke et al. |
| 6,140,144 A * | 10/2000 | Najafi et al. ................... 438/53 |
| 6,229,215 B1 * | 5/2001 | Egawa ........................ 257/777 |
| 6,239,484 B1 * | 5/2001 | Dore et al. ................. 257/687 |
| 6,265,771 B1 * | 7/2001 | Ference et al. ............. 257/706 |
| 6,291,267 B1 * | 9/2001 | Dore et al. ................. 438/108 |
| 6,369,449 B2 * | 4/2002 | Farquhar et al. ............ 257/778 |
| 6,424,033 B1 * | 7/2002 | Akram ........................ 257/718 |
| 6,461,895 B1 * | 10/2002 | Liang et al. ................. 438/107 |

FOREIGN PATENT DOCUMENTS

| | | | |
|---|---|---|---|
| JP | 406350068 A | * | 12/1994 |
| JP | 407183478 A | * | 7/1995 |

* cited by examiner

*Primary Examiner*—Matthew Smith
*Assistant Examiner*—Chuong A Luu
(74) *Attorney, Agent, or Firm*—DeLio & Peterson, LLC; John J. Tomaszewski; Margaret A. Pepper

(57) ABSTRACT

An electronic device is provided comprising a stacked integrated circuit chip assembly wherein the top chip of the assembly is solder connected to the surface of an interconnection substrate with the other chips of the assembly being enclosed in a cavity in the interconnection substrate wherein the cavity and electrical connections of the assembly and between the substrate and top chip are sealed by supplying an encapsulant to the cavity through a through opening in the substrate which communicates with the cavity.

5 Claims, 2 Drawing Sheets

TECHNIQUE FOR UNDERFILLING STACKED CHIPS ON A CAVITY MLC MODULE

BACKGROUND OF THE INVENTION

1. Field of the Invention

The present invention relates to chip containing electronic devices and, in particular, to electronic devices containing an assembly of a plurality of electrically connected stacked chips wherein typically a larger top chip of the assembly is electrically connected to a multi-layer ceramic (MLC) cavity substrate and a smaller lower chip or chips of the assembly are enclosed in the cavity of the substrate and to a method of their manufacture.

2. Description of Related Art

Electronic components utilizing integrated circuit chips are used in a number of applications. Controlled Collapse Chip Connection is an interconnect technology developed by IBM as alternative to wire bonding. This technology is generally known as C4 technology or flip chip packaging. Broadly stated, one or more integrated circuit chips are mounted above a single or multi-layer substrate and pads on each chip are electrically connected to corresponding pads on the substrate by a plurality of electrical connections such as solder bumps. The integrated circuit chips may be assembled on the substrate in a solder bump array such as a 10×10 array. The chip containing substrate is then typically electrically connected to another electronic device such as a circuit board by pin connectors with the total package being used in an electronic device such as a computer.

Flip chip packaging is described in U.S. Pat. No. 5,191,404 which patent is hereby incorporated by reference. In general, flip chip joining is desirable for many applications because the footprint or area required to bond the chip to the substrate is equal to the area of the chip itself. Flip chip joining also exploits the use of a relatively small solder bump which typically measures a height of approximately 1 mil to 1.5 mils and a width of approximately 2 to 4 mils to join the pads on the chip to corresponding pads on the substrate. Electrical and mechanical interconnects are formed simultaneously by reflowing the bumps at an elevated temperature. The C4 joining process is self-aligning in that the wetting action of the solder will align the chip's bump pattern to the corresponding substrate pads. This action compensates for chip to substrate misalignment up to several mils which may be incurred during chip placement.

In the joined flip chip package there is necessarily an opening or space between the pad containing surface of the integrated circuit chip and the pad containing surface of the joined substrate resulting from the thickness of the pads on each surface and the solder bump connection between the pads. This open space can not be tolerated because any interference with the solder connections will adversely affect the performance of the package. For example, moisture, the infusion of thermal paste used to increase heat transfer from the chip and the mechanical integrity of the chip due to the possible breaking of the solder bump electrical connections are all serious problems. To solve these problems, the solder bumps of the joined integrated circuit chips and substrate are typically encapsulated totally or a sealant is used around the chip edges to seal the joined opening.

The encapsulation of integrated circuit chips bonded to substrates to improve their reliability is well known. For non C-4 joining, chips wire bonded or tap bonded are typically completely encapsulated in a transfer molded thermoset or thermoplastic polymer. Basically, this process involves melting the polymer in a cavity within the mold. A plunger then rams the molten polymer through an orifice into the mold ventricle. The integrated circuit chip and substrate are bonded to each other using a polymeric adhesive and the package is placed in the mold and the molten polymer forces in and around the package to totally encapsulate the device.

Flip chip bonding offers many advantages in electronics manufacture compared to the complete encapsulation techniques above and one of the most important is the ability to remove and replace the chip without scrapping the substrate. This removal of the chip by heating and lifting of the chip from the substrate and replacement with typically a new chip is termed rework and can be performed numerous times without degrading the quality or reliability of the reworked electronic component.

Encapsulation of the flip chip packages however presents rework and other problems. The flip chip package must also be reliable and thermal mismatches between the encapsulant, chip, substrate and/or solder bumps must be minimized to avoid stressing and damaging of the package. The encapsulant must also be able to be heated and softened for the lift-off procedure.

Recent developments in electronic component fabrication now provide components utilizing an assembly of stacked chips, instead of a single chip, mounted to a substrate. In general, a plurality of chips are C-4 bonded in a stack assembly resulting in corresponding spaces between each of the bonded chips. Typically, the chips are of about the same size (width and length and surface area) and are mounted to a top chip having a larger width and length and surface area which larger chip has peripheral non-bonded pads and forms the top of the stacked assembly. Once the chips are joined in the assembly, the peripheral non-bonded pads of the top chip of the stacked assembly are then C4 joined to an MLC substrate. This substrate has a cavity to accommodate the smaller connected stacked chips and the uppermost top stacked chip overlies the periphery of the cavity. The peripheral non-bonded C4 bumps on the top chip are then C4 bonded to the surface of the substrate with the smaller stacked chips being positioned and enclosed in the cavity.

The conventional chip underfill process to encapsulate the space between a single chip bonded to a non-cavity substrate surface typically positions the bonded chip above the top of the substrate and then applies the underfill material to the substrate adjacent to the periphery of the chip to be underfilled. Capillary action draws the underfill encapsulated material into the space between the chip and the substrate to form a void free filled space between the chip and the substrate. This technique works very well for a single chip attached to the surface of a substrate but is not reliable for stacked chip assemblies wherein the stacked chips are enclosed in a cavity of a substrate.

Bearing in mind the problems and deficiencies of the prior art, it is therefore an object of the present invention to provide a stacked integrated circuit chip assembly comprising a plurality of electrically connected chips with the chip assembly being electrically connected to an interconnection substrate forming an electronic package wherein peripheral non-bonded pads on the uppermost top chip of the assembly are electrically connected to pads on the interconnection substrate with the stacked lower chip or chips of the assembly being enclosed in a cavity in the interconnection substrate with the solder connections between the stacked chips and cavity area being effectively sealed (encapsulated) to provide mechanical, electrical and chemical reliability for the electronic package.

It is another object of the present invention to provide a method for making an electronic component comprising a stacked integrated circuit chip assembly comprising a plurality of electrically connected chips electrically connected to a substrate, the component package having enhanced electrical, mechanical and chemical reliability properties wherein non-electrically connected peripheral pads on the top uppermost stacked chip of the assembly are electrically connected to pads on the surface of the interconnection substrate by solder connections with the lower chip or chips of the assembly being enclosed in a cavity in the substrate and the solder connections between the stacked chips and the cavity encapsulated with an encapsulant.

Still other objects and advantages of the invention will in part be obvious and will in part be apparent from the specification.

SUMMARY OF THE INVENTION

In one aspect of the invention an electronic device is provided having enhanced mechanical, electrical and chemical reliability comprising an assembly of a plurality of stacked electrically connected integrated circuit chips having a top chip and a bottom chip, the top chip having a larger width and length and a larger surface area than the other chips in the assembly and having peripheral non-bonded conductive pads thereon which peripheral pads are electrically connected to corresponding conductive pads on the surface of an interconnection substrate by solder connections between the corresponding sets of pads, the interconnection substrate having a cavity having an open area smaller than the surface area of the top chip and an open area larger than the other chips which cavity accommodates and encloses the bottom chip and other chips of the assembly other than the top chip and wherein the cavity and solder connections between the chips are filled with an encapsulant by supplying an encapsulant material to the cavity through a through opening in the substrate which communicates with the cavity, the opening extending from a surface of the substrate to the cavity.

In the method of the invention to make the electronic device, the encapsulant is typically heated and liquified and caused to flow through the opening into the cavity and the encapsulant flows into the cavity and spaces between the stacked chips and between a space between the periphery of the top chip and the substrate surface preferably substantially filling the cavity and encapsulating all of the solder bump connections including the peripheral solder connections of the top chip providing a mechanically, electrically and chemically stabilized and sealed stacked chip assembly containing electronic device.

In yet another aspect of the present invention, a method is provided for making an electronic component comprising an assembly of a plurality of electrically connected stacked integrated circuit chips and an interconnection substrate, wherein peripheral conductive pads on a top chip of the stacked assembly are electrically connected to corresponding pads on the surface of the interconnection substrate by solder connections between their corresponding pairs of pads the method comprising the steps of:

providing an integrated circuit chip electrically connected stacked assembly containing a plurality of chips wherein the top chip of the assembly contains peripheral pads which are electrically connected to corresponding pads on the surface of an interconnection substrate by a plurality of solder connections forming a space between the pad containing surface of the top chip and the pad containing surface of the substrate with the other chips of the stacked assembly being enclosed in a cavity in the substrate;

providing a fluid encapsulant; and supplying the encapsulant to the cavity through a through opening in the substrate extending from a surface of the substrate and communicating with the cavity and sealing the cavity and encapsulating the solder connections between the stacked chips and the space between the top chip and the interconnection substrate with the encapsulant.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
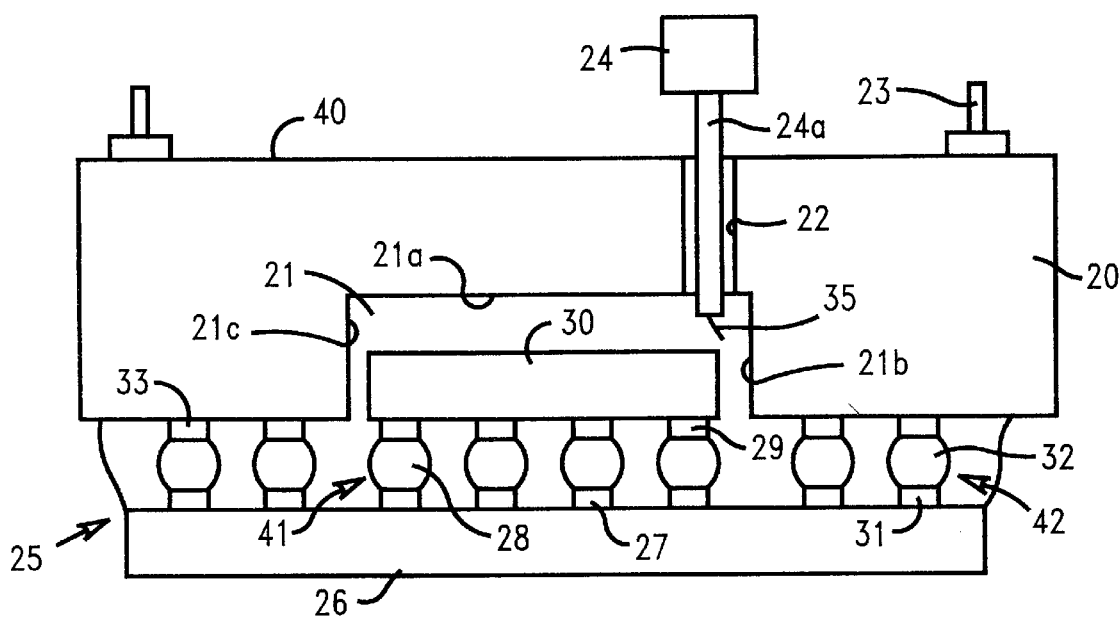
FIG. 1 is a cross-sectional view of an electronic component comprising a cavity containing substrate to which substrate a stacked chip assembly comprising a bottom chip and an electrically connected larger top chip is electrically attached, with the bottom chip enclosed within the cavity and peripheral pads on the top chip being electrically connected to the surface of the substrate and the cavity and electrical connections sealed.

In describing the preferred embodiments of the present invention, reference will be made herein to FIGS. 1–4 of the drawings in which like numerals refer to like features of the invention. Features of the invention are not necessarily shown to scale in the drawings.

Figure 3:
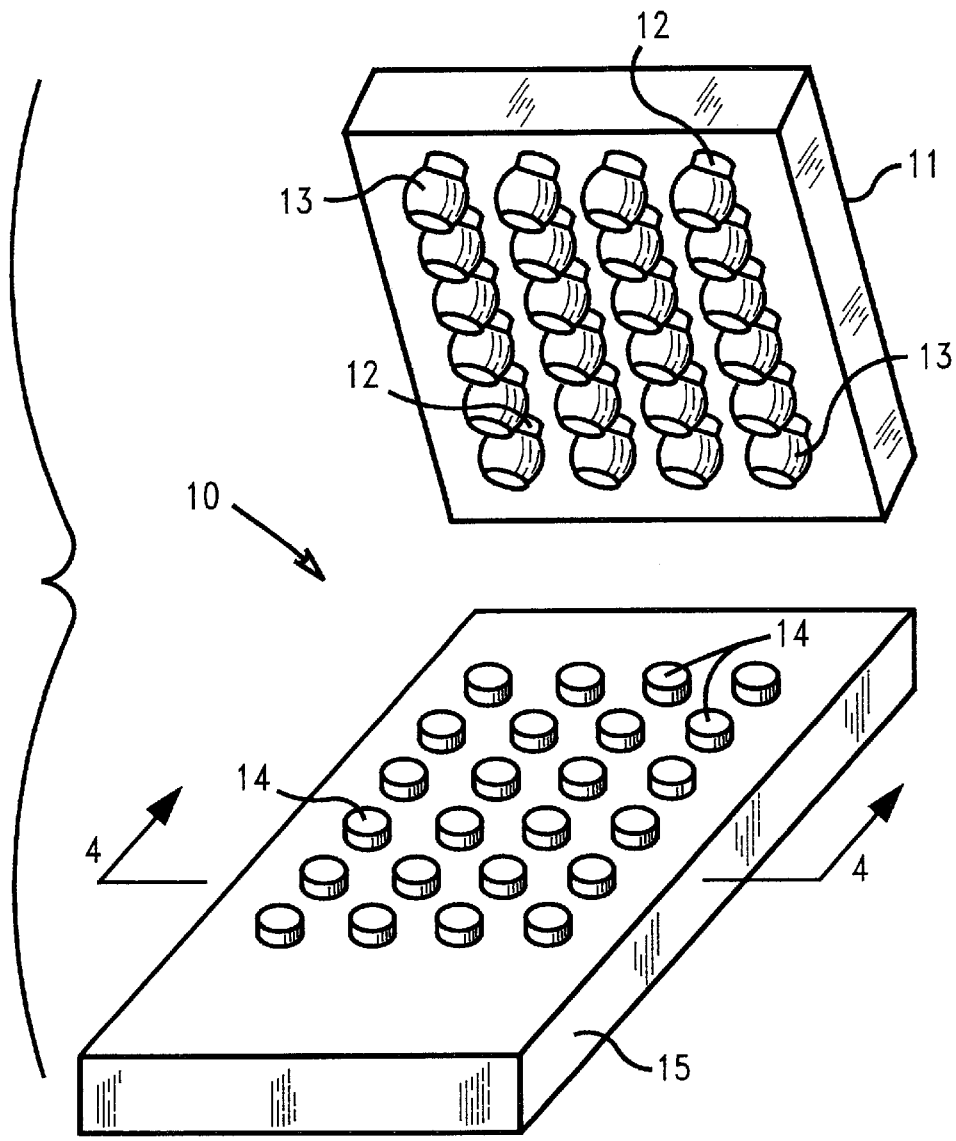
FIG. 3 is a perspective view of an electronic component of the prior art comprising an integrated circuit chip containing pads and solder bumps which chip is to be electrically joined to corresponding pads on a non-cavity interconnection substrate.
Figure 4:
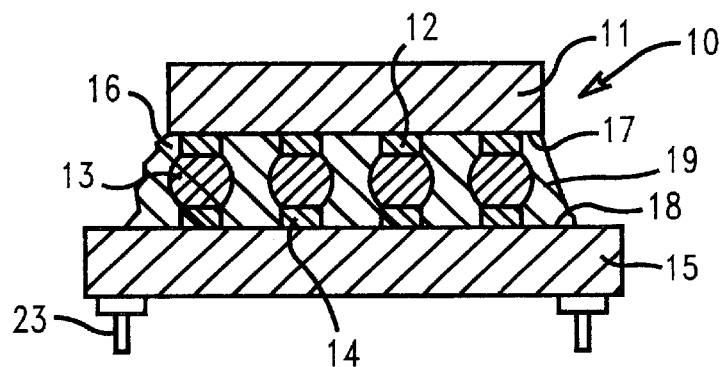
FIG. 4 is a cross-sectional view of FIG. 3 along lines 4—4 after the chip is joined to the substrate showing the chip and substrate electrical interconnections being totally encapsulated.

Referring first to FIGS. 3 and 4, a typical prior art non-cavity electronic component 10 is shown comprising integrated circuit chip 11 and interconnection substrate 15. Integrated circuit chip 11 is shown having conductive pads 12 overlaid with solder bumps 13. Corresponding conductive pads 14 are shown on substrate 15. Referring to FIG. 4, electronic component 10 is depicted in cross-section wherein integrated circuit chip 11 is solder connected to interconnection substrate 15. The chip 11 is electrically connected to the substrate 15 by a plurality of solder connections 13 such as solder bumps, in a method known as C4 or flip chip packaging. The lower surface of substrate 15 may contain connectors such as pin connectors 23 for connection of the substrate 15 to another electronic device such as a circuit board.

The solder interconnections 13 of electronic component 10 as shown in FIG. 4 are encapsulated by a thermoplastic polymer or other encapsulant 16 shown filling the space 19 between pad containing surface 17 of chip 11 and pad containing surface 18 of substrate 15. The encapsulant 16 is shown both around the periphery of chip 11 and under the chip totally encapsulating all the solder bump 13 connections.

Figure 2A:
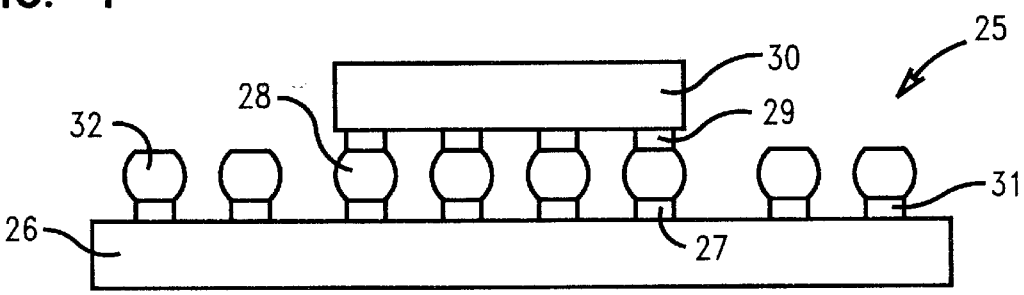
FIG. 2A is a side view of a stacked chip assembly as in FIG. 1 ready for electrical attachment to a cavity containing substrate.

FIG. 1 shows a stacked chip assembly 25, as shown in FIG. 2A, electrically connected to a cavity containing substrate 20.

Referring to FIGS. 1 and 2A, the integrated circuit chips 26 and 30 used to form the stacked assembly 25 may be any of a number of integrated circuit devices such as passive devices or a very large scale integration (VLSI) or ultra large scale integration (ULSI) active devices. Exemplary devices are static random access memory (SRAM), dynamic (DRAM), microprocessor and ASIC chips and combinations thereof.

Interconnection substrate 20 is shown in FIG. 1 having a cavity 21 and may be constructed of any number of suitable substrate materials such as ceramic or metal. Alumina, glass ceramic, and the like are exemplary. Interconnection substrate 20 is typically a multi-layer substrate. It is preferable to use similar materials for both the chips 30 and 26 of assembly 25 and substrate 20 to minimize thermal mismatch for the formed electronic component and to enhance the integrity of the solder bumps 32 bonding the chip assembly 25 to the substrate 20, which bumps might otherwise be damaged due to thermal expansion when the electronic component is on.

Chip assembly 25 is electrically connected to substrate 20 by flip chip C4 joining which involves aligning the pads 31 and solder bumps 32 of chip 26 of stacked assembly 25 with the pads 33 of substrate 20 and then joining the chip 26 of the stacked assembly 25 and the substrate 20 by heating to melt the solder bumps 32 and forming an electrical and mechanical connection between the chip 26 (and assembly 25) and substrate 20. This process is usually called solder reflow.

Stacked chip assembly 25 as shown in FIG. 2A is first fabricated before attachment to substrate 20 by solder bonding bottom chip 30 to top chip 26 by aligning pads 27 and 29 and solder bumps 28 and reflowing the solder. This procedure is shown schematically in FIG. 3 where bump containing pads on chip 11 are bonded to pads on substrate 15. In this case, the substrate 15 is chip 26. The stacked assembly 25 is then solder joined to substrate 20 as described hereinabove.

As shown in FIG. 1, top chip 26 is larger (in width and length and surface area) than bottom chip 30 and overlies the periphery or side walls 21b and 21c of cavity 21. Chip 30 is shown surrounded and enclosed in cavity 21. Encapsulant 35 is shown being forced into cavity 21 from dispenser 24 through inlet tube 24a which extends into through opening 22. Through opening 22 extends from surface 40 of substrate 20 to wall 21a into cavity 21. The encapsulant 35 fills the cavity 21 and the space 41 between chip 30 and chip 26 and between the space 42 between chip 26 and substrate 20. The encapsulant 35 is shown extending to the periphery of chip 26.

Once the stacked chip assembly 25 has been electrically connected to substrate 20, the substrate 20 can be electrically connected to another electronic device by processes well known in the art such as card join. This is accomplished by a variety of input/output methods. Pin grid arrays, such as 23 shown on FIG. 1, Ball grid arrays, wire or cast column arrays are all connection strategies to second level packaging which may be used.

The materials used for encapsulation may be high temperature thermoplastic resins and may be selected from a number of resins having the properties necessary to provide the desired C4 encapsulation and mechanical, electrical and chemical reliability characteristics of the electronic components of the invention. In general, the encapsulant must not degrade, have a suitable glass transition temperature and viscosity characteristics for filling the cavity and be capable of reworking. It is also important that the resins be soluble in solvents such as N-methylpyrolidone (NMP) for applying the resin to the C4 assembly and for reworkability of the sealed C4 assembly. Other solvents include common aldehydes, ketones, tetrahydrofuran, HFIP and gamma-butyrolactone. An exemplary encapsulant is a modified epoxy.

Fillers have been used in encapsulants of the prior art to reduce and/or control the coefficient of thermal expansion or control the flow of the encapsulant during application and drying. This is important to minimize cracking or other problems caused by uneven thermal expansion of the chip, substrate, solder bump and encapsulant during use of the electronic component and such fillers may be used in the present invention.

Filled resins may also be employed for special situations where it is desired to, for example, control the viscosity of the resin during the encapsulation process. Any of the usual fillers may be used such as silica, ceramic, glass/ceramic, barium titanate, alumina, Kevlar, boron, carbon and PBI fibers in an amount typically of, by weight, about 0.1 to 0.5% or more.

The encapsulation process is performed by melting or liquifying the encapsulant 35 and forcing the encapsulant into cavity 21 through through opening 22 in substrate 20. A dispensing tool 24 having an injection tube 24a may be used to force the encapsulant into the cavity.

Referring again to FIG. 1, a through opening 22 is provided in substrate 20 from the lower wall 21a of cavity 21 to the surface 40 of the substrate. The through opening 22 preferably extends from the lower wall 21a of the cavity to the surface 40 of the substrate which surface is not being joined to the stacked chip assembly. A dispenser 24, preferably having a elongated tube 24a, is inserted into opening 22 and is used to dispense a paste or encapsulant 35 into cavity 21. This process is performed after stack assembly chip 25 has been solder attached to substrate 20.

The through opening 22 is preferably positioned near (adjacent) the periphery or side walls 21b or 21c of cavity 21 and preferably extends in a straight line from the surface 40 of the substrate to the cavity 21. The through opening 22 at this position has been found to allow capillary action to draw the encapsulant or underfill material into the spaces between the chips before the cavity is filled. The through opening 22 may also be provided in cavity side walls 21b or 21c or centrally in wall 21a, however this is not as preferred as the through opening 22 at or near the periphery of cavity 21.

The use of a through opening 22 in substrate 20 has also been found to provide a number of other significant advantages for underfilling a stacked chip assembly in a substrate having a cavity. For one, the through opening 22 allows for the expansion of gases in the cavity during reflow without disturbing connections of the larger chip 26 to the substrate 20. Typically, the space 42 between the chip and the substrate may be filled with flux and prevent gases from escaping and without the through hole, the expanded gases can force the chip off the surface of the substrate during reflow and result in a poor or non-existing connection.

For dispensing the underfill material 35, it is preferred that the substrate 22 be positioned with the cavity and connected chip assembly downward. Accordingly, as shown in FIG. 1, the chip assembly 25 is placed downward with the substrate surface 40 being on top. This is preferred so that the space between the chips and the C4 areas are filled void free before the remainder of the larger volume cavity is filled. As noted hereinabove, in a conventional process for encapsulating a single chip bonded to a substrate, the encapsulant would be dispensed with the chip in an upward position. Using this type process the encapsulant may wick between the large chip and the substrate but may also wick between the substrate and the small chip before the space between the chips is filled. This creates an air pocket which adversely affects the reliability of the connection.

Through opening 22 in substrate 20 may be formed in any convenient manner. It can be formed into the substrate prior to firing, but is preferred to be machined into the ceramic after firing. It can also be ultrasonically machined in the ceramic after firing. The diameter of the through opening 22 may vary widely and is typically about 0.5 to 3 mm in diameter. A typical substrate 20 may range from about 21 mm wide to 64 mm on each side and 2 mm to 10 mm thick with the cavity opening about 5 mm to 22 mm on each side and 1 mm to 3 mm deep. The depth of cavity 21 (height of sidewalls 21b and 21c) and the length of lower wall 21a are sufficient to accommodate the stacked chips without contact with sidewalls 21b or 21c of lower wall 21a and will vary depending on the number of stacked chips in the stack chip assembly 25. Typically the cavity 21 will allow for about 0.25 mm to 1 mm clearance between the sidewalls 21b and 21c of the cavity and the stacked chips and about 0.2 mm to 0.5 mm clearance between the lower wall 21a and the top of the stacked chip. The larger chip 26 which is electronically attached to substrate 20 will overly the periphery of the cavity 21 and typically be about 2 mm to 10 mm larger than the opening of the cavity 21.

Figure 2B:
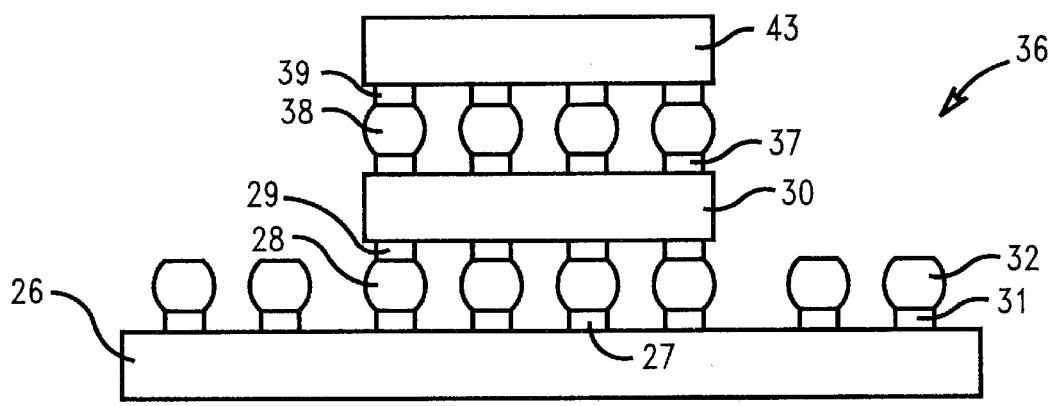
FIG. 2B is a side view of a stacked chip assembly comprising a larger chip electrically connected to an intermediate chip, which intermediate chip is electrically connected to another chip.

In FIGS. 1 and 2A only one chip 30 is shown stacked on larger chip 26 and accordingly the cavity is sized to fit the one chip 30. A plurality of chips can be stacked on larger chip 26 as is known in the art. Such a stacked chip assembly is shown in FIG. 2B where another chip 43 is electrically connected to chip 30 by pads 37 and 39 and solder bump 38.

Referring now to FIG. 2A, a stack chip assembly 25 is shown ready for electrical connection to a substrate 20 as shown in FIG. 1. Thus, a smaller chip 30 is shown attached to a larger chip 26 by solder connections 28 between bonding pads 27 of chip 26 and bonding pads 29 of chip 30. Larger chip 26 has peripheral bonding pads 31 with solder bumps 32 attached thereto. When chip assembly 25 is to be electrically connected to substrate 20, the solder bumps 32 of chip 26 are aligned with pads 33 of substrate 20 and the solder reflowed joining chip 26 of stack chip assembly 25 to substrate 20. The stacked chip-substrate assembly is then ready for underfill as shown in FIG. 1 using the method of the invention as described hereinabove.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making an electronic component comprising an assembly of a plurality of electrically connected stacked integrated circuit chips and an interconnection substrate, wherein peripheral conductive pads on a top chip of the stacked assembly are electrically connected to corresponding pads on the surface of the interconnection substrate by solder connections between their corresponding pairs of pads the method comprising the steps of:

providing an integrated circuit chip electrically connected stacked assembly containing a plurality of chips having a top chip and a bottom chip wherein the top chip of the assembly has a larger width and length and a larger surface area than other chips in the assembly and contains peripheral pads which are electrically connected to corresponding pads on the surface of an interconnection substrate by a plurality of solder connections forming a space between the pad containing surface of the top chip and the pad containing surface of the substrate with the other chips of the stacked assembly being enclosed in a cavity in the substrate, the cavity having an open area smaller than the surface area of the top chip and an open area larger than the other chips, which cavity accommodates and encloses the bottom chip and other chips of the assembly other than the top chip;

providing a fluid encapsulant; and supplying the encapsulant to the cavity through a through opening in the substrate extending from a surface of the substrate and communicating with the cavity and sealing the cavity and encapsulating the solder connections between the stacked chips and the space between the top chip and the interconnection substrate with the encapsulant.

2. The method of claim 1 wherein the through opening extends from the bottom wall of the cavity to the interconnection substrate surface.

3. The method of claim 2 wherein the through opening is straight.

4. The method of claim 3 wherein the through opening is at or near the periphery of the cavity.

5. The method of claim 1 wherein two or more stacked chips are electrically connected to the top chip.

* * * * *